United States Patent
Lowery et al.

(10) Patent No.: US 6,351,069 B1
(45) Date of Patent: Feb. 26, 2002

(54) RED-DEFICIENCY-COMPENSATING PHOSPHOR LED

(75) Inventors: Christopher H. Lowery, Fremont; Gerd Mueller; Regina Mueller, both of San Jose, all of CA (US)

(73) Assignee: LumiLeds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/252,207

(22) Filed: Feb. 18, 1999

(51) Int. Cl.$^7$ ............................................... H05B 33/14
(52) U.S. Cl. ....................... 313/512; 313/503; 313/504; 313/501
(58) Field of Search ................................ 313/501, 512, 313/503, 504, 506, 509, 489, 486, 467; 257/98, 99, 100

(56) References Cited

U.S. PATENT DOCUMENTS

| | | | |
|---|---|---|---|
| 5,102,579 A | 4/1992 | Inaho et al. | 252/301.4 |
| 5,898,185 A | 4/1999 | Bojarczuk, Jr. et al. | 257/103 |
| 6,066,861 A | 5/2000 | Höhn et al. | 257/99 |
| 6,071,432 A * | 6/2000 | Yocom et al. | 252/301.45 |

FOREIGN PATENT DOCUMENTS

| | | | |
|---|---|---|---|
| DE | 2 260 285 | 6/1973 | |
| DE | 691 12 459 T2 | 5/1996 | |
| DE | 196 38 667 A1 | 4/1998 | |
| EP | 0 890 996 | 1/1999 | H01L/33/00 |
| JP | 7-99345 | 4/1995 | H01L/33/00 |
| WO | WO 97/48138 | 12/1997 | H01L/33/00 |
| WO | WO98/05078 | 2/1998 | H01L/33/00 |
| WO | WO 98/05078 | 5/1998 | |
| WO | WO 98/39805 | 9/1998 | H01L/33/00 |
| WO | WO 99/02026 | 1/1999 | |

OTHER PUBLICATIONS

English Language Translation corresponding to German Application No. DE 196 38 667, 26 pages.
English Language Abstract corresponding to PCT Application No. WO 98/05078, 1 page.

* cited by examiner

Primary Examiner—Michael H. Day
Assistant Examiner—Joseph Williams
(74) Attorney, Agent, or Firm—Skjerven Morrill MacPherson LLP; Brian D. Ogonowsky; Mark E. Schmidt

(57) ABSTRACT

A light emitting device and a method of fabricating the device utilize a supplementary fluorescent material that radiates secondary light in the red spectral region of the visible light spectrum to increase the red color component of the composite output light. The secondary light from the supplementary fluorescent material allows the device to produce "white" output light that is well-balanced with respect to color for true color rendering applications. The supplementary fluorescent material is included in a fluorescent layer that is positioned between a die and a lens of the device. The die is preferably a GaN based die that emits light having a peak wavelength of 470 nm. The fluorescent layer also includes a main fluorescent material. Preferably, the main fluorescent material is Cerium (Ce) activated and Gadolinium (Gd) doped Yttrium Aluminum Garnet (YAG) phosphor ("Ce:YAG phosphor"). In a first preferred embodiment, the supplementary fluorescent material is a compound that is produced by doping the Ce:YAG phosphor with a trivalent ion of Praseodymium (Pr). In a second preferred embodiment, the supplementary fluorescent material is Europium (Eu) activated Strontium Sulphide (SrS) phosphor. The amount of supplementary phosphor in the fluorescent layer can vary depending on the amount of red color that may be required in the white output light. The exact amount of supplementary phosphor is not critical to the invention.

18 Claims, 5 Drawing Sheets

RED-DEFICIENCY-COMPENSATING PHOSPHOR LED

TECHNICAL FIELD

The invention relates generally to light emitting diodes and more particularly to a phosphor light emitting diode.

DESCRIPTION OF THE RELATED ART

Light emitting diodes (LEDs) are well-known solid state devices that can generate light having a peak wavelength in a specific region of the light spectrum. LEDs are typically used as illuminators, indicators and displays. Traditionally, the most efficient LEDs emit light having a peak wavelength in the red region of the light spectrum, i.e., red light. However, a type of LED based on Gallium Nitride (GaN) has recently been developed that can efficiently emit light having a peak wavelength in the blue region of the spectrum, i.e., blue light. This new type of LED can provide significantly brighter output light than traditional LEDs.

In addition, since blue light has a shorter wavelength than red light, the blue light generated by the GaN-based LEDs can be readily converted to produce light having a longer wavelength. It is well known in the art that light having a first peak wavelength (the "primary light") can be converted into light having a longer peak wavelength (the "secondary light") using a process known as fluorescence. The fluorescent process involves absorbing the primary light by a photoluminescent phosphor material, which excites the atoms of the phosphor material, and emits the secondary light. The peak wavelength of the secondary light will depend on the phosphor material. The type of phosphor material can be chosen to yield secondary light having a particular peak wavelength. An LED that utilizes the fluorescent process will be defined herein as a "phosphor LED."

With reference to FIG. 1, a prior art phosphor LED 10 is shown. The LED 10 includes a GaN die 12 that generates blue primary light when activated. The GaN die 12 is positioned on a reflector cup lead frame 14 and is electrically coupled to leads 16 and 18. The leads 16 and 18 conduct electrical power to the GaN die 12. The GaN die 12 is covered by a layer 20 that includes fluorescent material 22. The type of fluorescent material utilized to form the layer 20 can vary, depending upon the desired spectral distribution of the secondary light that will be generated by the fluorescent material 22. The GaN die 12 and the fluorescent layer 20 are encapsulated by a lens 24. The lens 24 is typically made of a transparent epoxy.

In operation, electrical power is supplied to the GaN die 12 to activate the GaN die. When activated, the GaN die 12 emits the primary light, i.e., blue light, away from the top surface of the GaN die 12. A portion of the emitted primary light is absorbed by the fluorescent material 22 in the layer 20. The fluorescent material 22 then emits secondary light, i.e., the converted light having a longer peak wavelength, in response to absorption of the primary light. The remaining unabsorbed portion of the emitted primary light is transmitted through the fluorescent layer 38, along with the secondary light. The lens 24 directs the unabsorbed primary light and the secondary light in a general direction indicated by arrow 26 as output light. Thus, the output light is a composite light that is composed of the primary light emitted from the GaN die 12 and the secondary light emitted from the fluorescent layer 20.

The output light may have a spectral distribution such that it appears to be "white" light. The color composite of the output light will vary depending upon the spectral distributions and intensities of the secondary light and the primary light.

PCT Application No. PCT/JP97/02610 by Shimizu et al. describes various phosphor LEDs that generate white output light having a color temperature somewhere between 5,000 to 6,000 degrees Kelvin. The LEDs of Shimizu et al. are schematically identical to the LED 10 of FIG. 1. In one embodiment, the LED of Shimizu et al. utilizes Yttrium Aluminum Garnet (YAG) phosphor to convert some of the primary light into secondary light having a peak wavelength of about 580 nm. The spectral distribution 28 of the output light from the Shimizu et al. LED is shown in FIG. 2. The spectral distribution 28 has two peaks 30 and 32. The peak 30 is predominately caused by the primary light emitted from the GaN die of the Shimizu et al. LED. The peak 32 is predominately caused by the secondary light emitted from the YAG phosphor.

A concern with the Shimizu et al. LED is that the "white" output light has an undesirable color balance for a true color rendition. The output light of the Shimizu et al. LED is adequate for applications in which simple illumination is required. However, for applications in which a high color rendition is desired, the output light is deficient in the red region of the visible light spectrum (647–700 nm range). When used for such applications, the red deficiency in the output light causes illuminated red objects to appear less intense in color than they would under a white light having a well-balanced color characteristic. In particular, when used as a backlight for color liquid crystal displays (LCD), the output light of the Shimizu et al. LED causes red colors to be weakly displayed on the LCD. A separate red light source may have to be used in conjunction with the Shimizu et al. LED to compensate for the red deficiency of the output light generated by the Shimizu et al. LED, adding complexity to the system embodying the Shimizu et al. LED.

What is needed is a phosphor LED that can generate white output light having a well-balanced color characteristic for a true color rendition.

SUMMARY OF THE INVENTION

A light emitting device and a method of fabricating the device utilize a supplementary fluorescent material that radiates secondary light in the red spectral region of the visible light spectrum to increase the red color component of the composite output light. The secondary light from the supplementary fluorescent material allows the device to produce "white" output light that is well-balanced for true color rendering applications. As an example, the device can be used as backlight for a color LCD or a light source for a color scanner.

The light emitting device is an LED that includes a die that emits primary light in response to an electrical signal. Preferably, the die is a Gallium Nitride (GaN) based die that emits blue light having a peak wavelength of 470 nm. The die is encapsulated by an optional transparent layer. The optional transparent layer provides a generally uniform surface for the next layer. Preferably, the optional transparent layer is made of clear resin. The next layer is a fluorescent layer that contains the supplementary fluorescent material. The fluorescent layer also includes the main fluorescent material that radiates broadband secondary light having a first peak wavelength in the yellow region of the visible light spectrum. Coupled to the fluorescent layer is a lens that operates to direct the lights from the die and the fluorescent layer in a direction generally normal to the upper surface of the die.

In operation, the GaN die is activated by electrical power that is supplied to the die via leads. When activated, the GaN die emits the primary light, i.e., blue light, away from the upper surface of the die. The emitted primary light propagates through the optional transparent layer to the fluorescent layer. A portion of the primary light impinges upon the main fluorescent material in the fluorescent layer. The main fluorescent material absorbs the impinging primary light and emits the secondary light having the first peak wavelength. Another portion of the primary light impinges upon the supplementary fluorescent material in the fluorescent layer. The supplementary fluorescent material absorbs the impinging primary light and emits the second light having the second peak wavelength in the red spectral region of the visible light spectrum. However, some of the primary light will not be absorbed by either the main fluorescent material or the supplementary fluorescent material. The amount of primary light that will be unabsorbed by the fluorescent layer is a function of a number of variables. These variables include the thickness of the fluorescent layer and the density of fluorescent material in the layer.

The unabsorbed primary light and the two secondary lights propagate through the lens of the LED. The lens generally directs the propagating lights toward the direction normal to the upper surface of the die. The propagating lights emanate from the lens as the white output light. The color composite of the white output light depends on the intensities and spectral distributions of the emanating light emissions.

In a first preferred embodiment, the main fluorescent material is Cerium (Ce) activated and Gadolinium (Gd) doped Yttrium Aluminum Garnet (YAG) phosphor ("Ce:YAG phosphor"), while the supplementary fluorescent material is chemically-altered Ce:YAG phosphor. The chemically-altered Ce:YAG phosphor is a compound that is produced by doping the Ce:YAG phosphor with the trivalent ion of Praseodymium (Pr).

In a second preferred embodiment, the main fluorescent material is also the Ce:YAG phosphor. However, the supplementary fluorescent material is Europium (Eu) activated Strontium Sulphide (SrS) phosphor. ("Eu:SrS"). Preferably, the amount of Eu:SrS phosphor is approximately equal to or less than 10% of the total phosphor weight in the fluorescent layer. The amount of Eu:SrS phosphor in the fluorescent layer can vary, depending on the amount of red color that may be required in the white output light. The exact amount of Eu:SrS phosphor is not critical to the invention.

The method of fabricating the device in accordance with the present invention includes a step in which a light source is provided that emits primary light having a first peak wavelength. Preferably, the light source is a GaN die that emits the primary light having a peak wavelength of approximately 470 nm. Next, a first layer of transparent resin is deposited over the light source, forming an encapsulation layer. In another step, a phosphor-resin mixture is prepared. The phosphor-resin mixture includes two fluorescent materials that are combined with a resin paste. The first fluorescent material has a property of emitting secondary light having a peak wavelength at the yellow region of the visible light spectrum in response to the primary light. Preferably, the secondary light emitted by the first fluorescent material has a broadband spectral distribution. The second fluorescent material has a property of emitting secondary light having a peak wavelength in the red region of the visible light spectrum.

In a first preferred method, the phosphor-resin mixture is prepared by mixing the first fluorescent material of Ce:YAG phosphor with the second fluorescent material of Eu:SrS phosphor. In this preferred embodiment, the phosphor-resin mixture may include, approximately by weight, 74% resin, 18% Ce:YAG phosphor and 8% Eu:SrS phosphor. The amount of a particular phosphor in the phosphor-resin mixture can vary depending on the desired color composite of the white output light that will be generated by the LED.

In a second preferred method, the phosphor-resin mixture is prepared by initially doping the Ce:YAG phosphor with a trivalent ion of the element Pr, yielding a phosphor Pr, Ce:YAG. The portion of the Ce:YAG phosphor that has been unaffected by the doping process constitutes the first fluorescent material in the phosphor-resin mixture. The portion of the Ce:YAG phosphor that has been altered by the doping process constitutes the second fluorescent material. Similar to the previous embodiment, the amount of a particular phosphor in the phosphor-resin mixture can vary depending on the desired color composite of the white output light.

Next, the phosphor-resin mixture is deposited over the encapsulation layer to form a fluorescent layer that uniformly covers the encapsulation layer. The deposited phosphor-resin mixture may then be gelled, i.e., partially cured. A second layer of transparent resin is deposited over the fluorescent layer to form a lens of the LED. Next, the second layer of resin and the fluorescent layer are collectively and completely cured in a single process. The collective curing of the layers ensures the intimate bonding of the fluorescent layer to the lens.

An advantage of the present invention is that the light generating device can provide a composite white output light that is well-balanced with respect to color. In particular, the composite white output light has a greater amount of red color than conventional phosphor LEDs. This characteristic makes the device ideal for applications in which a true color rendition is required without the need to incorporate a supplemental red light source to compensate for any red color deficiency.

DETAILED DESCRIPTION

Figure 1:
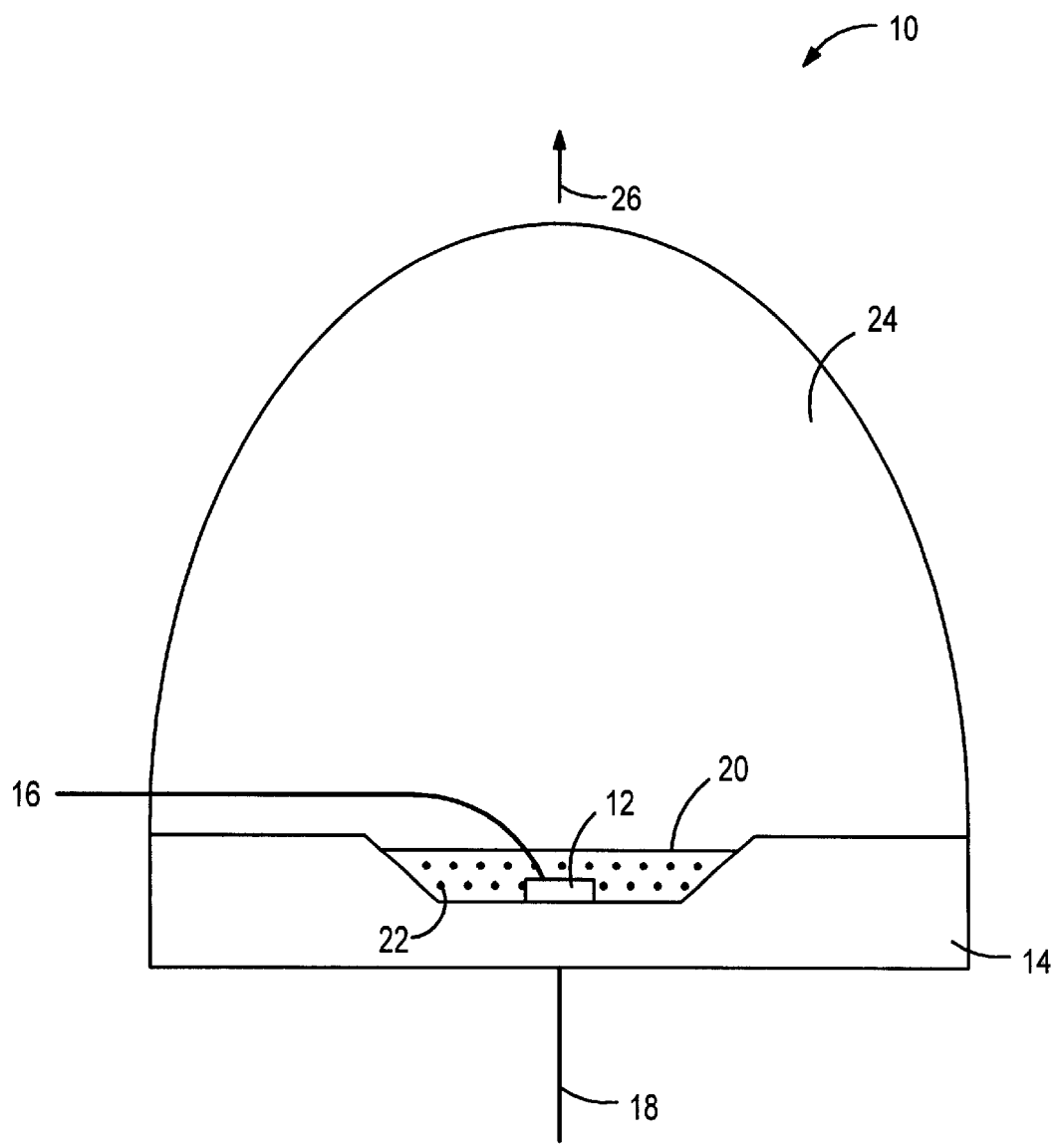
FIG. 1 is a diagram of a generic prior art phosphor light emitting diode (LED).
Figure 3:
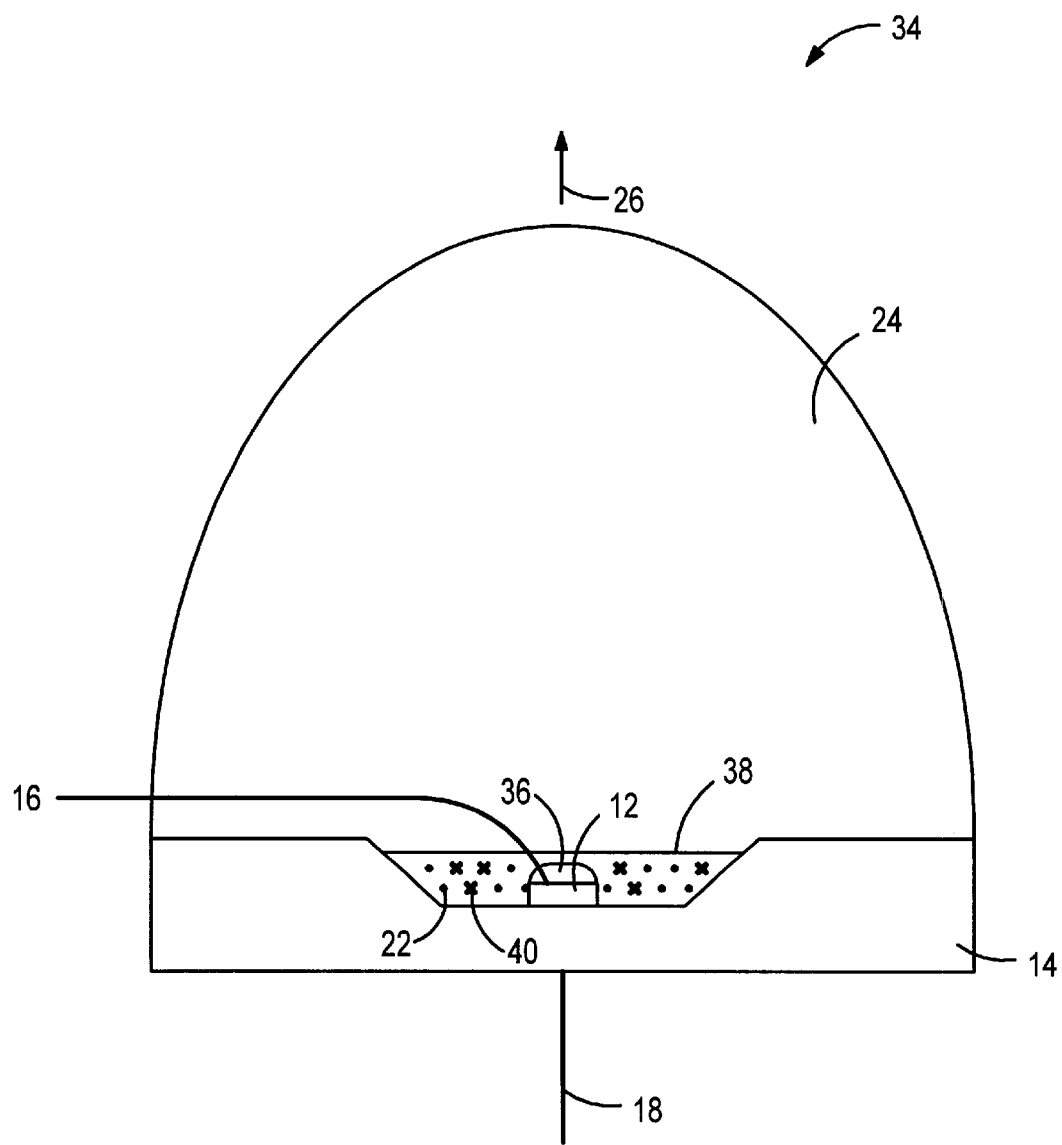
FIG. 3 is a diagram of a red-deficiency-compensating phosphor LED in accordance with the present invention.

With reference to FIG. 3, a red-deficiency-compensating phosphor light emitting diode (LED) 34 in accordance with the present invention is shown. When applicable, the same reference numerals of FIG. 1 will be used for corresponding components illustrated in FIG. 3. The LED 34 is designed to produce "white" output light that is well-balanced with respect to color to provide illumination for a true color rendition. The LED 34 includes the Gallium Nitride (GaN) die 12 that is positioned on the reflector cup lead frame 14 and is electrically coupled to the leads 16 and 18. The leads 16 and 18 provide excitation power to the GaN die 12. The GaN die 12 may generally be in a shape of a square. In the preferred embodiment, the GaN die 12 is configured to emit primary light having a peak wavelength of 470 nm, which lies within the blue region of the light spectrum, i.e., blue light. The GaN die 12 is covered by a spacing layer 36 made of a transparent material. The transparent material may be clear epoxy or glass.

Adjacent to the spacing layer 36 is a fluorescent layer 38. The fluorescent layer 38 includes the fluorescent material 22 and a second fluorescent material 40. The fluorescent material 22 has a property to absorb the primary light and emit secondary light having a first peak wavelength, while the fluorescent material 40 has a property to absorb the primary light and emit secondary light having a second peak wavelength. Preferably, the secondary light emitted by the fluorescent material 22 has a broadband spectral distribution centered in the yellow region of the visible spectrum. However, the secondary light emitted by the fluorescent material 40 has a narrow spectral distribution that is intense in the red region of the visible spectrum. Thus, when the primary light and the secondary lights emitted by the fluorescent materials 22 and 40 are combined, white light is created that is rich in red color, in addition to other colors. The peak wavelengths of the secondary lights depend on the composition of the fluorescent materials 22 and 40, in addition to the peak wavelength of the primary light.

The fluorescent layer 38 is encapsulated by the lens 24 that operates to direct an unabsorbed portion of the primary light and the secondary lights in a general direction indicated by the arrow 26. The lens 24 is preferably made of a transparent material, such as clear epoxy. However, other transparent materials, such as glass, may be utilized. The transparent material used to form the lens 24 is not critical to the invention. The secondary lights from the fluorescent materials 22 and 40 in the layer 38 and the unabsorbed portion of the primary light exit the lens 24 as the white output light.

In operation, the GaN die 12 is activated by electrical power that is supplied to the GaN die 12 via the leads 16 and 18. When activated, the GaN die 12 emits the primary light away from the top surface of the GaN die 12. The emitted primary light propagates through the spacing layer 36 to the fluorescent layer 38. A portion of the primary light impinges upon the fluorescent material 22 in the layer 38. The fluorescent material 22 will absorb the impinging primary light and emit the secondary light having the first peak wavelength. Another portion of the primary light will impinge upon the fluorescent material 40 in the layer 38. The fluorescent material 40 will absorb the impinging primary light and emit the second light having the second peak wavelength. However, some of the primary light will not be absorbed by either the fluorescent material 22 or the fluorescent material 40. The unabsorbed portion of the primary light will propagate through the fluorescent layer 38. The secondary lights from the flourescent materials 22 and 40 in the layer 38 and the unabsorbed primary light from the GaN die 12 are focused by the lens 24 and exit the LED 34 as the white output light, propagating in the general direction of the arrow 26. The combination of the unabsorbed primary light from the GaN die 12 and the secondary lights from the fluorescent material 22 and 40 in the layer 38 yields the white output light that is well-balanced with respect to color.

In a first preferred embodiment, the fluorescent material 22 is Cerium (Ce) activated and Gadolinium (Gd) doped Yttrium Aluminum Garnet (YAG) phosphor ("Ce:YAG phosphor"), and the fluorescent material 40 is altered Ce:YAG phosphor. The altered Ce:YAG phosphor is a non-stoichiometric compound that is produced by doping the Ce:YAG phosphor with a trivalent ion of Praseodymium (Pr). The presence of Pr in the Ce:YAG phosphor has the effect of "taking over" the functions of the Ce3+ by the Pr3+. The result is that the Pr produces secondary emission that is concentrated in the red region of the visible spectrum, instead of a typical broadband secondary emission from Ce:YAG phosphor that is generally centered in the yellow region of the visible spectrum. The amount of Pr doped Ce:YAG phosphor in the fluorescent layer 38 can vary, as well as the amount of Pr in the modified Ce:YAG, depending on the amount of red color that may be required in the white output light for a particular application.

Figure 2:
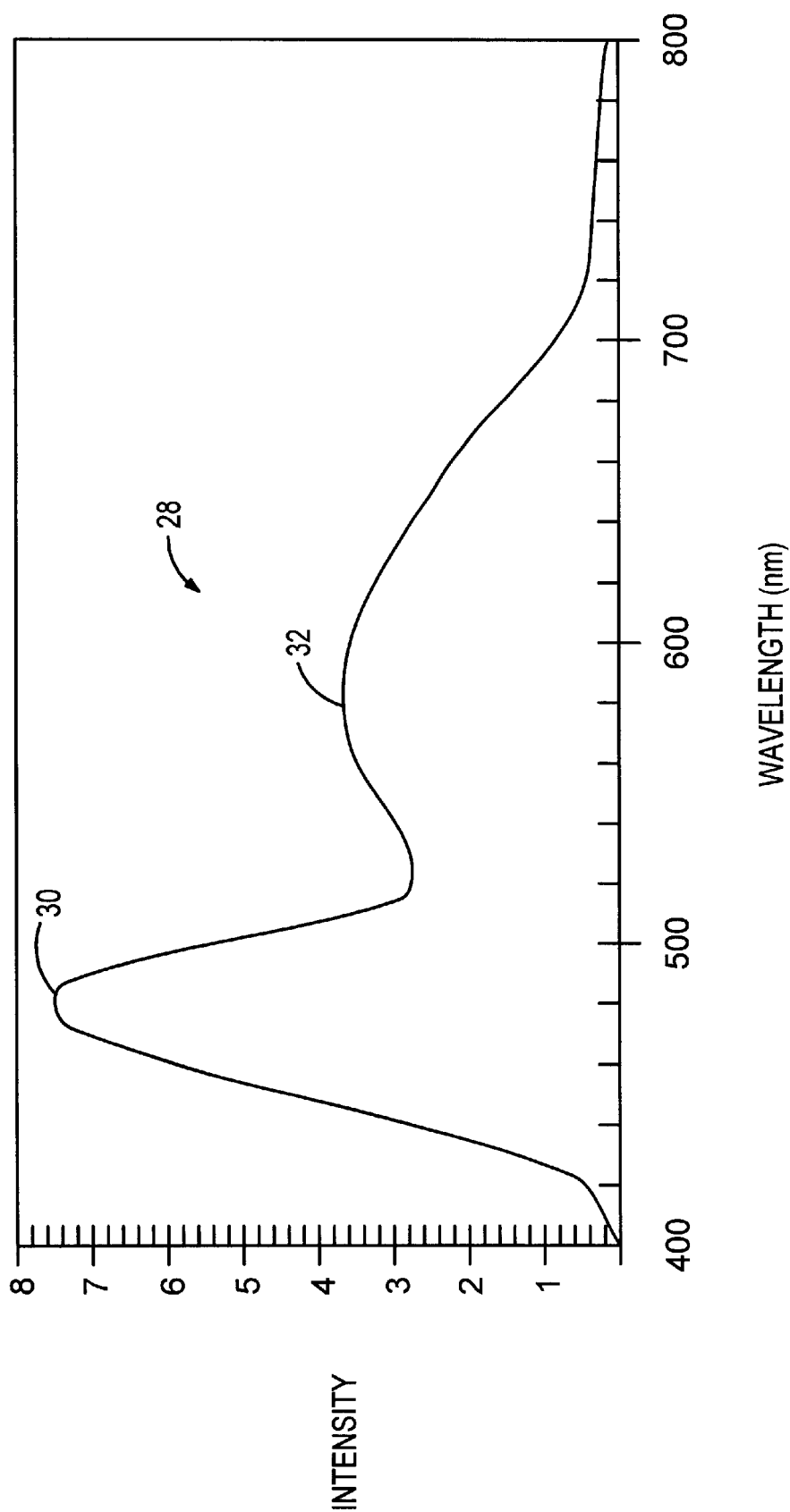
FIG. 2 is a graph showing a spectral distribution of an output light from a specific prior art phosphor LED.
Figure 4:
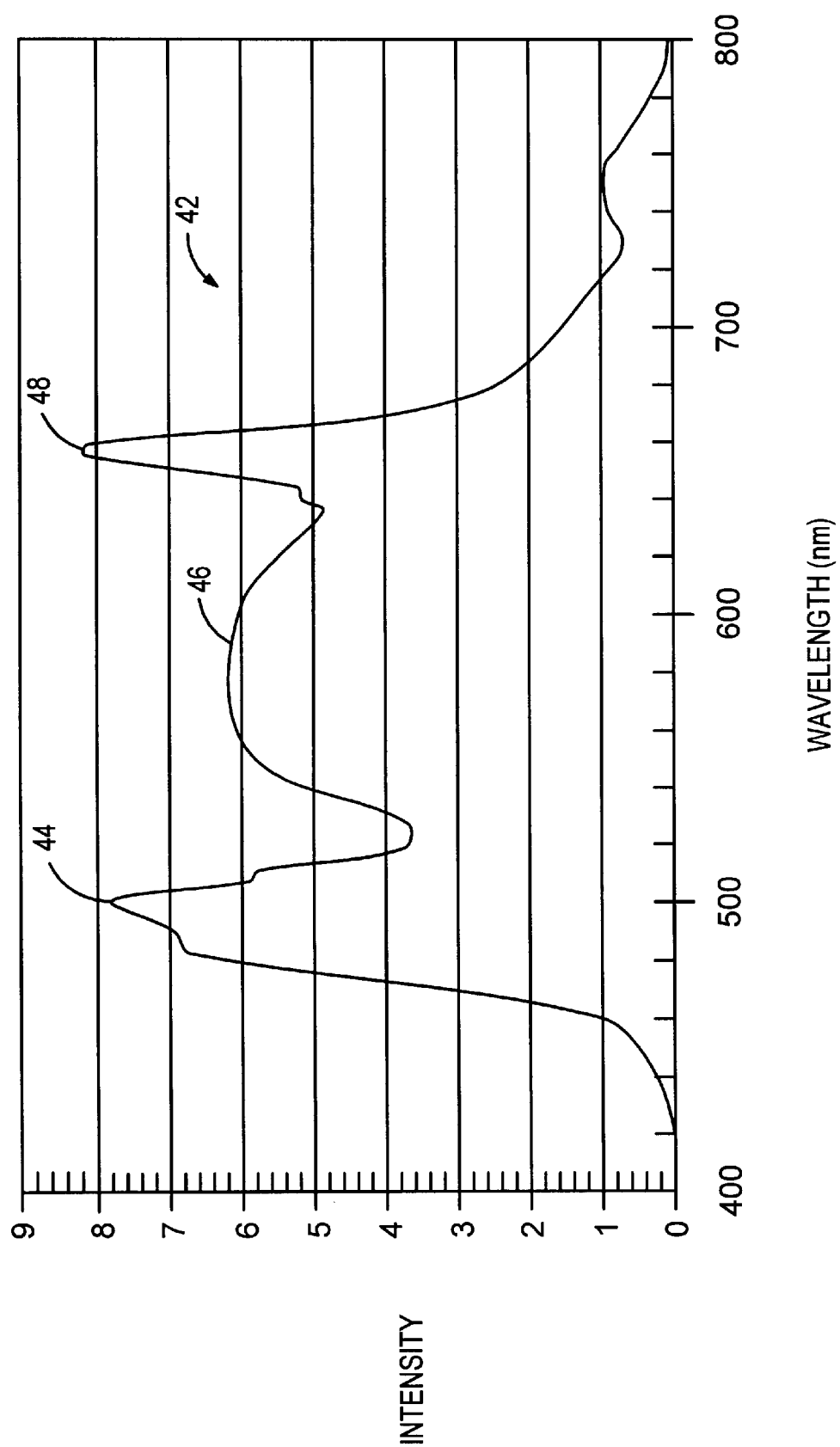
FIG. 4 is a graph showing a spectral distribution of an output light from the phosphor LED of FIG. 3 in accordance with a first embodiment.

In FIG. 4, a spectral distribution 42 of the white output light generated by the LED 34 in accordance with the first preferred embodiment is shown. The spectral distribution 42 includes peaks 44, 46 and 48. The peak 44 is primarily caused by the unabsorbed primary emission component from the LED light. The peak 46 is primarily caused by the secondary emission from the fluorescent material 22, while the peak 48 is primarily caused by the secondary emission from the fluorescent material 40. When compared with the spectral distribution 28 of the white output light generated by the prior art LED of Shimizu et al., (FIG. 2) the apparent difference in the spectral distribution 42 is the extra peak 48 which is in the red region of the visible spectrum. Thus, the white output light generated by the LED 34 has a significant additional amount of red color, as compared to the output light generated by the prior art LED of Shimizu et al. The LED 34 in accordance with the first preferred embodiment may be configured to generate white output light having a color temperature of 3,800 degrees Kelvin and a Color Rendering Index of 85.

In a second preferred embodiment, the fluorescent material 22 is also Ce:YAG phosphor. However, the fluorescent material 40 is Europium (Eu) activated Strontium Sulfide (SrS) phosphor ("Eu:SrS"). Preferably, the amount of Eu:SrS phosphor is equal to or less than 10% of the total phosphor weight in the layer 38. The amount of Eu:SrS phosphor in the layer 38 can vary depending on the amount of red color that may be required in the white output light. The exact amount of Eu:SrS phosphor in the layer 38 is not critical to the invention.

The second preferred embodiment only differs from the first preferred embodiment in that the composition of the fluorescent material 40 varies for the two embodiments. However, the fluorescent material 40 for both embodiment operates to enhance the red color component of the white output light to compensate for any red color deficiency. Since the operation of the two embodiments are virtually identical, the spectral distribution of the output light for the second preferred embodiment is very similar to the spectral distribution 42 of the output light generated by the first preferred embodiment. Thus, the spectral distribution of the white output light generated by the LED 34 in accordance with the second embodiment would also have a peak wavelength in the red region of the visible light spectrum.

Figure 5:
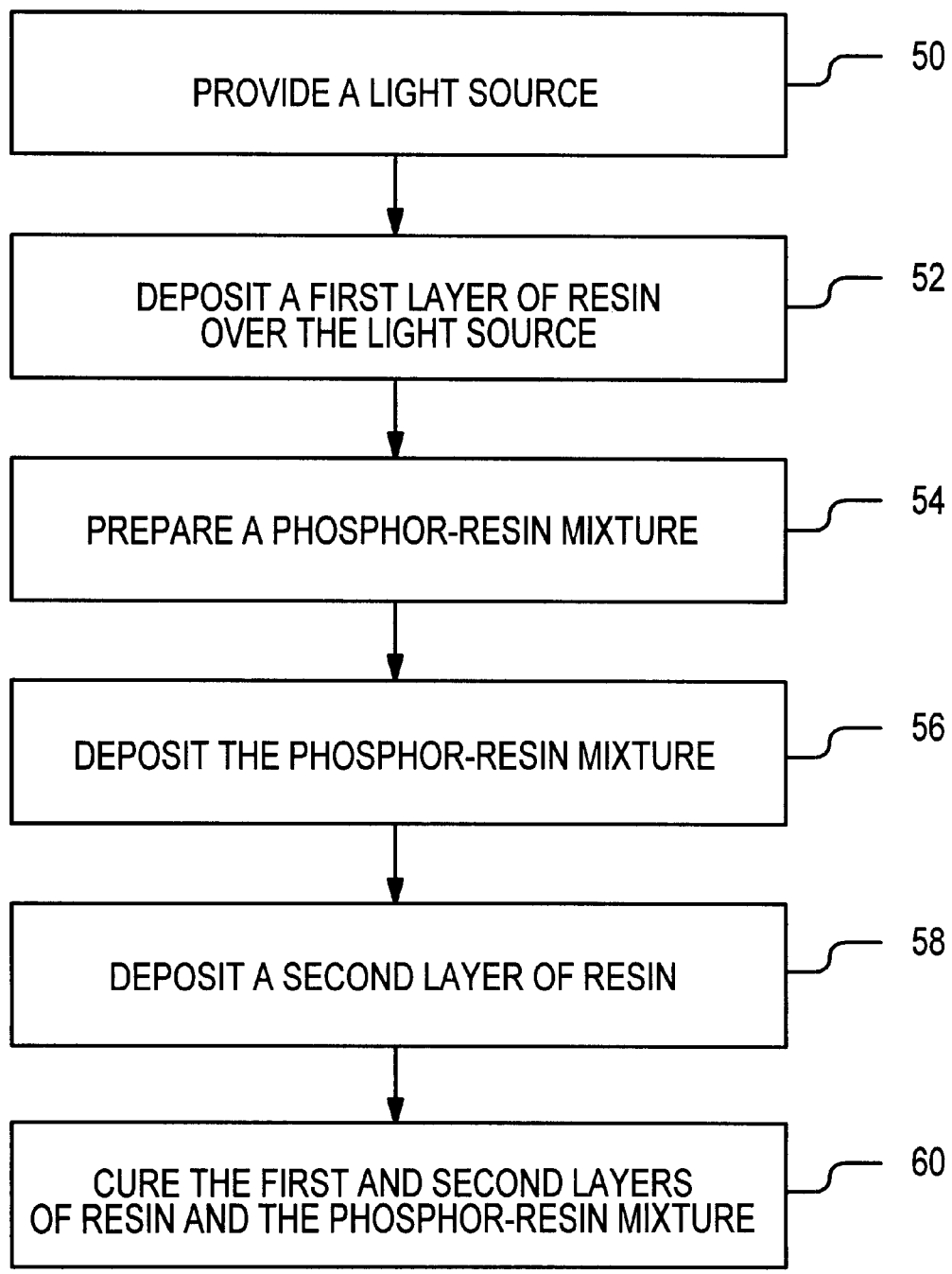
FIG. 5 is a flow diagram of a method of fabricating a phosphor LED in accordance with the present invention.

A method of fabricating a red-deficiency-compensating phosphor LED will be described with reference to a flow diagram in FIG. 5. At step 50, a light source is provided that emits primary light having a first peak wavelength. Preferably, the light source is a GaN die that emits the primary light having a peak wavelength of approximately 470 nm. Next, at step 52, a first layer of transparent resin is deposited over the light source, forming an encapsulation layer. Step 52 is not critical to the invention and may be omitted from the method. At step 54, a phosphor-resin mixture is prepared to form a fluorescent layer in the LED. The phosphor-resin mixture includes two fluorescent materials that are combined with a resin paste. The first fluorescent material has a property of emitting secondary light having a peak wavelength in the yellow region of the visible light spectrum in response to the primary light. Preferably, the secondary light emitted by the first fluorescent material has a broadband spectral distribution. The second fluorescent material has a property of emitting secondary light having a peak wavelength in the red region of the visible light spectrum.

In a first preferred method, the phosphor-resin mixture is prepared by mixing the first fluorescent material of Ce:YAG phosphor with the second fluorescent material of Eu:SrS phosphor. In this preferred embodiment, the phosphor-resin mixture may include, approximately by weight, 74%resin, 18% Ce:YAG phosphor and 8% Eu:SrS phosphor. The amount of a particular phosphor in the phosphor-resin mixture can vary, depending on the desired color composite of the white output light that will be generated by the LED. For example, the red color component of the white output light can be increased by adding more Eu:SrS phosphor in the phosphor-resin mixture.

In a second preferred method, the phosphor-resin mixture is prepared by initially doping the Ce:YAG phosphor with the trivalent ion of the element Pr. The portion of the Ce:YAG phosphor that has been unaffected by the doping process constitutes the first fluorescent material in the phosphor-resin mixture. The portion of the Ce:YAG phosphor that has been altered by the doping process constitutes the second fluorescent material. Similar to the previous embodiment, the amount of a particular phosphor in the phosphor-resin mixture can vary, depending on the desired color composite of the white output light.

Next, at step 56, the phosphor-resin mixture is deposited over the encapsulation layer to form a fluorescent layer that uniformly covers the encapsulation layer. The deposited phosphor-resin mixture may then be gelled, i.e., partially cured. At step 58, a second layer of transparent resin is deposited over the fluorescent layer to form a lens of the LED. The second layer of resin and the fluorescent layer are then collectively and completely cured in a single process, at step 60. The collective curing of the layers ensures the intimate bonding of the fluorescent layer to the lens.

What is claimed is:

1. A light emitting device comprising:
   light-generating means for emitting first light having a first peak wavelength in a first spectral range in response to an applied excitation signal;
   wavelength-conversion means optically coupled to said light-generating means to receive said first light for converting a portion of said first light to form composite light having a broadband spectral distribution, said wavelength-conversion means including a primary fluorescent material that converts said first light into second light having a second peak wavelength in a second spectral range, said wavelength-conversion means including a supplementary fluorescent material that converts said first light into third light having a third peak wavelength in a red spectral range of a visible light spectrum, said composite light being at least partially formed by said first light, said second light and said third light such that said broadband spectral distribution includes said first spectral range, said second spectral range and said red spectral range; and
   means in optical communication with said light-generating means and said wavelength-conversion means for directing said first light, said second light and said third light in a predetermined direction.

2. The device of claim 1 wherein said supplementary fluorescent material of said wavelength-conversion means includes Strontium Sulphide (SrS).

3. The device of claim 2 wherein said supplementary fluorescent material of said wavelength-conversion means includes Europium (Eu) activated Strontium Sulphide (SrS).

4. The device of claim 3 wherein said wavelength-conversion means contains less of said Europium (Eu) activated Strontium Sulphide (SrS) by weight than of said primary fluorescent material.

5. The device of claim 1 wherein said supplementary fluorescent material of said wavelength-conversion means includes trivalent Praseodymium (Pr3+).

6. The device of claim 2 further comprising an encapsulation layer between said light-generating means and said wavelength-conversion means, said encapsulation layer being made of a transparent epoxy.

7. The device of claim 1 wherein said primary fluorescent material of said wavelength-conversion means includes Yttrium Aluminum Garnet (YAG).

8. A method of fabricating a light emitting device comprising steps of:
   providing a light source that emits first light having a first peak wavelength;
   preparing a phosphor-epoxy mixture, said phosphor-epoxy mixture including a primary fluorescent material that emits second light having a second peak wavelength in response to exposure to said first light and a supplementary fluorescent material that emits third light having a third peak wavelength in a red spectral region of a visible light spectrum, said supplementary fluorescent material being responsive to exposure to said first light;
   depositing said phosphor-epoxy mixture over said light source to form a fluorescent layer that at least partially encapsulates said light source; and
   depositing a transparent material over said fluorescent layer to form a lens above said fluorescent layer.

9. The method of claim 8 wherein said step of preparing said phosphorepoxy mixture includes mixing said supplementary fluorescent material Europium (Eu) activated Strontium Sulphide (SrS) with said primary fluorescent material to derive said phosphor-epoxy mixture.

10. The method of claim 9 wherein said step of mixing said supplementary fluorescent material of said Europium (Eu) activated Strontium Sulphide (SrS) with said primary fluorescent material is a step of mixing said supplementary fluorescent material of said Europium (Eu) activated Strontium Sulphide (SrS) with said primary fluorescent material of Cerium (Ce) activated and Gadolinium (Gd) doped Yttrium Aluminum Garnet (YAG).

11. The method of claim 8 wherein said step of preparing said phosphor-epoxy mixture includes doping said primary fluorescent material of Cerium (Ce) activated and Gadolinium (Gd) doped Yttrium Aluminum Garnet (YAG) with trivalent Praseodymium (Pr3+) to derive said phosphor-epoxy mixture.

12. The method of claim 8 wherein said step of providing said light source is a step of providing a GaN based die that emits said first light having said first peak wavelength in a blue region of said visible light spectrum.

13. The method of claim 8 further comprising a step of collectively curing said phosphor-epoxy mixture and said transparent material to bond said phosphor-epoxy mixture to said transparent material.

14. A light emitting device comprising:
   a light source that emits first light having a first peak wavelength in a first spectral range in response to an applied electrical signal;

a fluorescent layer positioned over said light source to receive said first light emitted from said light source, said fluorescent layer including a first fluorescent material having a property of radiating second light having a second peak wavelength in a second spectral range in response to said first light, said fluorescent layer including a second fluorescent material having a property of radiating third light having a third peak wavelength in a red spectral range of a visible light spectrum;

a light-propagation medium optically coupled to said fluorescent layer to transmit said first light, said second light and said third light as composite output light in a direction away from said light source, said composite output light having a color characteristic at least partially determined by intensities of said first light, said second light and said third light.

15. The device of claim 14 wherein said second fluorescent material of said fluorescent layer includes Europium (Eu) activated Strontium Sulphide (SrS).

16. The device of claim 15 wherein said fluorescent layer includes less of said Europium (Eu) activated Strontium Sulphide (SrS) by weight than of said first fluorescent material.

17. The device of claim 14 wherein said second fluorescent material of said fluorescent layer includes trivalent Praseodymium (Pr3+).

18. The device of claim 14 wherein said first fluorescent material of said fluorescent layer includes Ytroium Aluminum Garnet (YAG).

* * * * *